(12) United States Patent
Luce

(10) Patent No.: US 8,527,231 B2
(45) Date of Patent: Sep. 3, 2013

(54) HIGH THROUGHPUT SEMICONDUCTOR DEVICE TESTING

(75) Inventor: Lawrence B. Luce, Sun Lakes, AZ (US)

(73) Assignee: Teradyne, Inc., North Reading, MA (US)

( * ) Notice: Subject to any disclaimer, the term of this patent is extended or adjusted under 35 U.S.C. 154(b) by 393 days.

(21) Appl. No.: 12/882,695

(22) Filed: Sep. 15, 2010

(65) Prior Publication Data
US 2012/0065906 A1 Mar. 15, 2012

(51) Int. Cl.
| | |
|---|---|
| G01R 29/00 | (2006.01) |
| G06F 11/26 | (2006.01) |
| G06F 17/40 | (2006.01) |
| G06F 19/00 | (2011.01) |

(52) U.S. Cl.
USPC .... 702/117; 73/865.9; 324/73.1; 324/750.01; 324/754.01; 324/762.01; 324/763.01; 702/58; 702/183; 702/187; 702/189

(58) Field of Classification Search
USPC ................. 73/432.1, 865.8, 865.9; 324/73.1, 324/500, 537, 750.01, 754.01, 762.01, 762.02, 324/762.06, 763.01; 702/1, 57, 58, 81, 82, 702/84, 108, 117, 121, 124, 127, 182, 183, 702/187, 189; 708/100, 105, 200
IPC ............ G01D 7/00; G01R 29/00, 31/00, 31/01, G01R 31/28, 31/2301, 31/282, 31/2832, 31/3851, G01R 31/317, 31/3181; G06F 11/00, 11/22, G06F 11/26, 11/30, 11/32, 17/00, 17/40, G06F 19/00
See application file for complete search history.

(56) References Cited

U.S. PATENT DOCUMENTS

| | | | | |
|---|---|---|---|---|
| 2,950,437 | A * | 8/1960 | Stahl | 324/73.1 |
| 2,996,666 | A * | 8/1961 | Baker | 324/73.1 |
| 3,082,374 | A * | 3/1963 | Buuck | 324/73.1 |
| 3,492,572 | A * | 1/1970 | Jones et al. | 714/740 |
| 3,597,682 | A * | 8/1971 | Hubbs et al. | 324/72.5 |
| 4,686,628 | A * | 8/1987 | Lee et al. | 702/117 |
| 4,833,403 | A | 5/1989 | Tamamura et al. | |
| 5,226,496 | A * | 7/1993 | Feinland et al. | 177/25.15 |
| 6,151,698 | A * | 11/2000 | Telichevesky et al. | 703/14 |

(Continued)

FOREIGN PATENT DOCUMENTS

| | | |
|---|---|---|
| JP | 9-178820 A | 7/1997 |
| JP | 2009-031129 A | 2/2009 |

OTHER PUBLICATIONS

International Search Report dated Apr. 17, 2012 for App. No. PCT/US2011/051038.

*Primary Examiner* — Edward Cosimano
(74) *Attorney, Agent, or Firm* — Wolf, Greenfield & Sacks, P.C.

(57) ABSTRACT

A test system that provides an output signal for analysis without requiring the test hardware to be idle during a settling interval. The test system includes a preprocessor that identifies the near-DC drift that occurs in the output signal and then adjusts the output signal to remove the near-DC drift. A set of values representing the near-DC drift at each of multiple times during the acquisition of a signal for analysis may be computed and used to model a settling profile of the signal by fitting a curve to the set of values. The model of the settling profile may then be subtracted from samples representing the output signal to provide an adjusted signal for further analysis.

23 Claims, 5 Drawing Sheets

(56) References Cited

U.S. PATENT DOCUMENTS 6,493,849 B1 * 12/2002 Telichevesky et al. ........... 703/2
6,839,694 B2 * 1/2005 Kasmin et al. ................ 705/407
2003/0229601 A1 * 12/2003 Kasmin et al. ................ 705/407
2006/0284661 A1 12/2006 Zhang

* cited by examiner

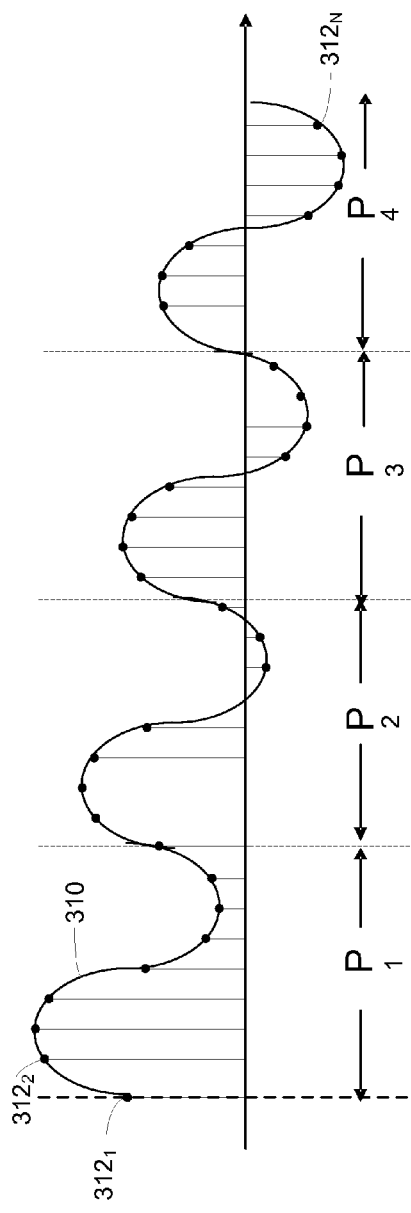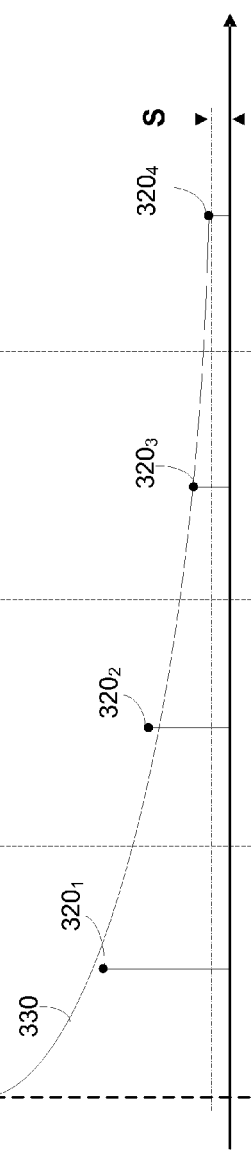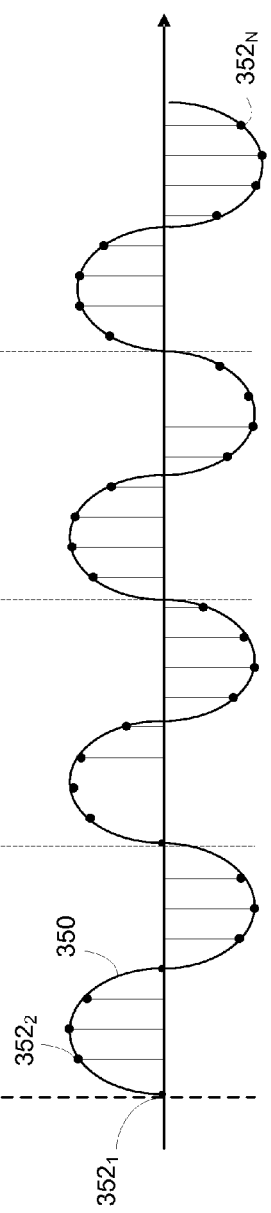

HIGH THROUGHPUT SEMICONDUCTOR DEVICE TESTING

BACKGROUND

1. Field of Invention

The invention relates generally to testing electronic devices and more particularly to increased throughput of a test system.

2. Related Art

During the manufacture of semiconductor devices, it is known to test the devices to ensure that they are working properly. Frequently, multiple tests are performed on each device, with each test involving applying stimulus signals to the device and then measuring response signals output by the device.

To support the large number of tests that must be performed in a semiconductor manufacturing facility, testing is performed by automatic test equipment. The test equipment can be programmed to generate electrical signals that can be applied to the device under test as a test stimulus. The test equipment can also be programmed to capture outputs from the device under test.

The captured signals are analyzed to determine whether the device under test is operating properly. If the analysis reveals that the device is not operating fully as desired, the manufacturing process performed on a device may be altered. For example, following testing, faulty devices may be discarded without further processing. Alternatively, devices that operate, but without meeting all desired performance criteria, can be "binned." Binning allows partially functioning devices to be sold, though often at a reduced price.

The nature of the output signals captured by a test system depends on the intended function of the device under test. Some semiconductor devices produce only digital outputs. Though, other devices produce only analog outputs or both analog and digital outputs. For example, semiconductor chips intended as controllers for cellular telephones or disk drives produce analog outputs. To support testing of devices that have analog outputs, automatic test equipment has analog signal capture components and signal processing circuitry, such as a digital signal processor, which may be dedicated hardware, or may be a general purpose processing unit performing digital signal processing operations. The digital signal processor processes the samples to determine values for parameters of the output signals, which can then be compared to acceptable ranges for those parameters to determine performance of the device under test. Examples of these parameters include signal amplitude, total harmonic distortion, in-band noise and magnitude of inter-modulation signals.

Testing of devices that produce analog output signals is generally performed using periodic signals, frequently sinusoidal signals. The output signals, once the device under test has responded to the input signal, is also likely to be periodic. This response does not occur instantaneously. Rather, immediately following application or change in a stimulus signal, there may a transition interval as the output transitions to a steady-state, periodic signal.

This transition interval is sometimes called a "settling interval," or "settling time", because the output signal is seen to be "settling" into its steady state condition. The signal may also be said to include a "near-DC drift" component during this interval, because the periodic signal, though oscillating during the settling interval, appears to oscillate about a level that changes slowly over time. The point about which the output signal oscillates "drifts" towards the point about which the output signal oscillates when it is settled. The near-DC drift, at any given time, represents the difference between this origin of the oscillation at that time during the settling interval and the origin of oscillation at steady state.

Particularly when testing what should be a periodic analog signal, if samples of a signal are collected while the signal is settling, values of parameters of the signal determined by processing those samples may yield incorrect conclusions about operation of the device. Such incorrect conclusions may be due to the influence of the drift on such measurements as Voltage Peak (Vpk) for instance, or due to spectral leakage in the frequency domain caused by the near-DC drift, as another example. To avoid incorrect test results, it is known in testing semiconductor devices to either not collect samples during the settling interval or to discard, without analyzing, samples collected during this settling interval. The settling interval may be set based on a desired level of accuracy, but may, for example, be the time it takes the DC drift to decrease by 95%. The settling time may alternatively be set empirically, as "enough" time that sufficiently few devices fail that would otherwise pass if a longer wait time was implemented.

The settling interval may be on the order of milliseconds or tens or hundreds of milliseconds for example. A full device test may require hundreds or thousands of individual tests, so these settling times add up. This settling time can be a relatively high percentage of the total time required to test a semiconductor device. The need to wait for output signals to settle every time a stimulus signal is applied or changed can create a scenario called "device limited throughput." Device limited throughput means that an automatic test system deployed in a semiconductor manufacturing environment has a capacity to test devices at a higher rate and could test devices at a higher rate were it not waiting during the settling intervals to gather usable samples.

Because of the high cost of establishing a semiconductor testing facility to support semiconductor manufacturing, and because such costs must be proportionally allocated to the total cost of manufacture of each device tested, having device limited throughput is undesirable.

SUMMARY

In one aspect, the invention may be embodied as a method of testing an electronic device. The method may include receiving a plurality of samples of a periodic signal representing an output of the electronic device. From at least a portion of the plurality of samples, a first settling profile of the periodic signal may be computed. The first settling profile may be subtracted from the plurality of samples to obtain a first plurality of adjusted samples. An analysis function may be performed on the first plurality of adjusted samples.

In another aspect, the invention relates to a method of manufacturing a semiconductor device. The manufacture may include testing the device and conditionally performing at least one manufacturing operation based on the results of testing the device.

In yet another aspect, the invention may be embodied as a test system. The test system may include a digitizer configured to receive an output of a device under test. A pre-processor may receive a plurality samples from the digitizer and derive a settling profile in the output of the device under test based on the plurality of samples. The settling profile may be subtracted from the plurality of samples to produce a plurality of adjusted samples. A processor configured to receive the plurality of adjusted samples may perform a test function based on the plurality of adjusted samples.

In yet another aspect, the invention may be embodied as a non-transitory, computer-readable storage medium comprising computer-executable instructions that, when executed, process a plurality of samples of a periodic signal representing an output of the electronic device. The processing may be performed according to a method that includes fitting a polynomial to at least a portion of the plurality of samples. Values based on the polynomial may be subtracted from the plurality of samples to provide adjusted samples, the values based on the polynomial representing settling in the output of the electronic device.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 3A-3C illustrate a process of adjusting an output signal according to some embodiments of the invention;

DETAILED DESCRIPTION

The inventor has recognized and appreciated that efficiency of electronic device manufacturing can be improved with a test system that generates accurate test results using samples of an output signal collected during a settling interval for the output signal. Through analysis of these samples, near-DC drift in the signal can be modeled. From a model of the near-DC drift, a settling profile of the signal can be identified. The settling profile can be used to adjust the captured samples to represent the output signal without the effect of near-DC drift that occurred during the settling interval.

Analysis functions performed based on the adjusted samples have an accuracy that approximates the accuracy that is achieved when the functions are performed on samples acquired after waiting for the settling interval. However, the time between the application of a stimulus signal to a device under test and a time when sufficient samples of an output signal have been captured is reduced by not waiting until the settling interval has passed to obtain samples usable in analyzing the output signal. When throughput of a test system is device limited, reducing the amount of time that test system resources are devoted to capturing an output from a device under test can increase the throughput of the test system, making the entire semiconductor manufacturing operation more efficient.

Rapid and accurate semiconductor device testing according to embodiments of the invention may be performed using an automatic test system constructed using techniques as are known in the art. However, the automatic test system may differ from a conventional test system in that it is adapted to capture and analyze outputs from a device under test during respective settling intervals for the output signals.

Figure 1:
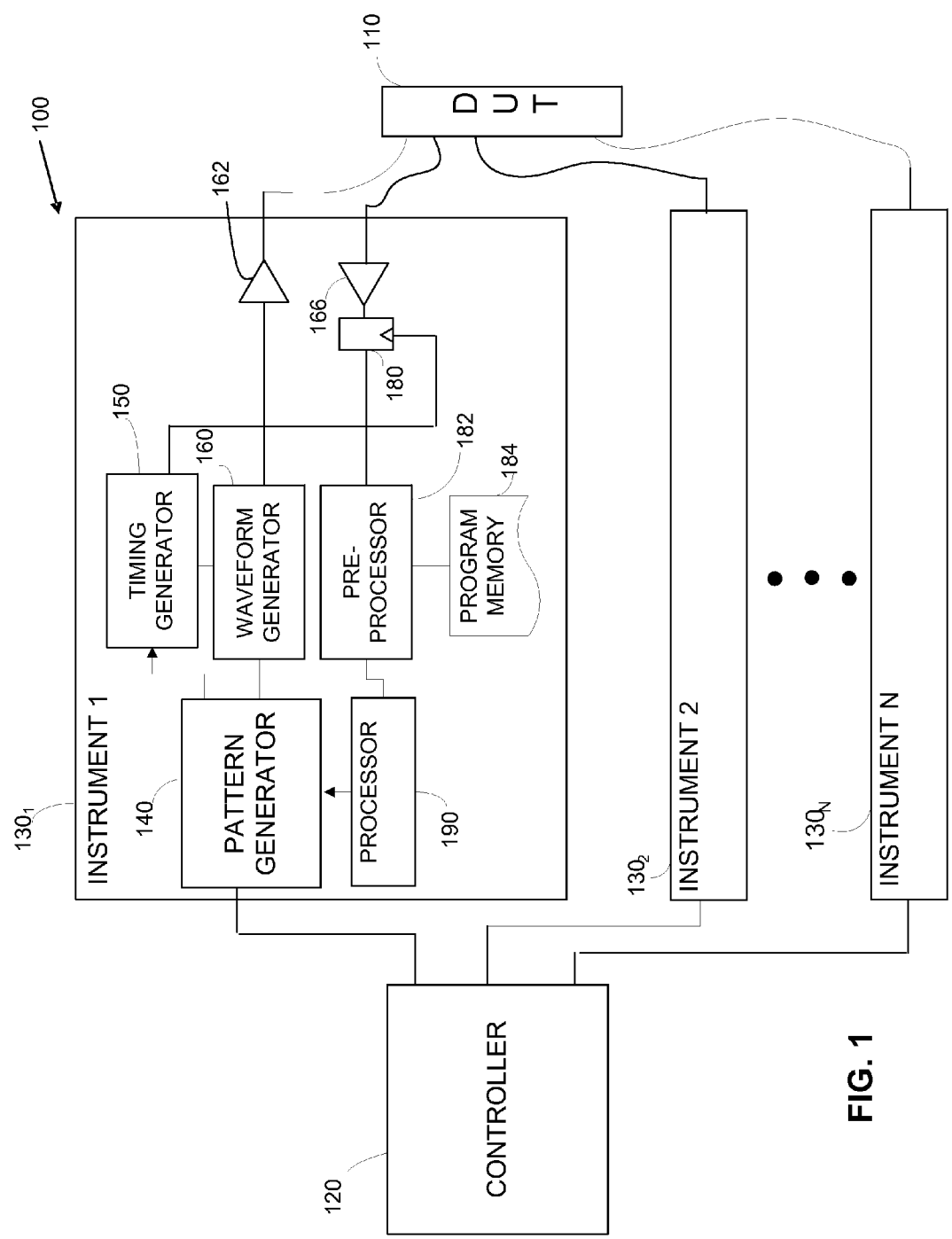
FIG. 1 is a functional block diagram of an automatic test system configured to test a semiconductor device.

FIG. 1 provides an example of a test system 100 that may capture and analyze outputs during a settling interval according to some embodiments of the invention. Test system 100 may be used in a facility for manufacturing semiconductor devices or electronic assemblies. Each of the devices or assemblies may be in any suitable stage of manufacture. In some scenarios, a test system, such as test system 100, may be used to test semiconductor devices while still in bare die form on a wafer with multiple other devices. In other scenarios, a test system, such as test system 100, may be used to test devices after they have been severed from a wafer and packaged as individual components. In still other scenarios, a test system, such as test system 100, may be used to test electronic assemblies. Moreover, these test operations may be performed in a manufacturing facility in which fabrication, packaging or other operations are performed during manufacture of semiconductor devices or electronic assemblies. Though, in some scenarios, semiconductor or electronic assembly manufacturing operations may be distributed such that test system 100 is located in a facility in which only test operations are performed. Accordingly, the specific stage in the manufacturing operation for semiconductor devices at which test system 100 is employed is not a limitation on the invention.

Test system 100 may be constructed using known techniques for constructing test equipment. In the specific example illustrated in FIG. 1, test system 100 includes a controller 120 and one or multiple instruments $130_1 \ldots 130_N$. Each of the instruments may generate one or more stimulus signals that are applied to one or more devices (or assemblies) under test DUT 110. Each of the instruments $130_1 \ldots 130_N$ may additionally or alternatively capture one or more output signals from DUT 110.

Operation of the instruments $130_1 \ldots 130_N$ may be controlled by a controller 120. Controller 120 may be programmed to control the instruments to generate and measure signals appropriate for analyzing a particular device or assembly under test. The number and types of stimulus signals generated collectively by the instruments $130_1 \ldots 130_N$ and the number and types of output signals from DUT 110 measured and analyzed by instruments $130_1 \ldots 130_N$ may depend on the intended operation of DUT 110. Accordingly, the specific number and types of signals generated and measured by instruments $130_1 \ldots 130_N$ is not critical to the invention.

The construction of each of the instruments $130_1 \ldots 130_N$ may depend on the specific signals that the instrument is to generate or measure. Accordingly, each of instruments $130_1 \ldots 130_N$ may be a circuit within a physical component implementing multiple instruments or may in other embodiments be separate physical components interconnected to form one of the instrument $130_1 \ldots 130_N$. In some embodiments, the invention may be employed with periodic analog signals. Though, in some embodiments, a test system may additionally generate and measure other types of analog or digital signals.

In the example of FIG. 1, instrument $130_1$ is an analog instrument, intended to generate an analog signal applied to DUT 110 as a stimulus signal for a test. Instrument $130_1$ is also configured to capture an analog signal output by DUT 110 and to analyze the captured signal. Analysis of the captured signal may reveal values of parameters that indicate whether DUT 110 is operating properly. Other instruments $130_2 \ldots 130_N$ may have similar constructions or may be configured to perform other test functions as are known in the art.

In the example of FIG. 1, instrument $130_1$ is shown controlled by a pattern generator 140. Pattern generator 140 may be a component as is known in the art in an automatic test system. Pattern generator 140 may be configured to control other components within instrument $130_1$, or in some embodiments other instruments, to generate a stimulus signal applied at a test point on DUT 110. Similarly, pattern generator 140 may control other components within instrument $130_1$ to measure and analyze an output signal from a test point on DUT 110. In the embodiments illustrated in FIG. 1, the test point at which a stimulus signal is applied is different than the test point at which the response signal is measured. However, it is not a requirement that the stimulus and response signals be measured at different points or that a stimulus signal be applied by the same instrument that measures the response signal. Moreover, it should be appreciated that more than one stimulus signal may be simultaneously applied to DUT 110 and more than one response signal may be measured as the output of DUT 110. Further, it should be appreciated that the stimulus signal need not be an analog signal and may, for example, be a digital signal that triggers operation of the device. In some embodiments when a device under test generates an analog output without any express input, there may be no express stimulus signal. Accordingly, it should be recognized that one stimulus and one response signal is shown only for simplicity of illustration.

For a complex device, multiple tests may be performed in order to assess whether the device is properly operating. Accordingly, pattern generator 140 may be programmed to control instrument $130_1$ to perform multiple tests on a single device under test. The timing at which each test is performed may be controlled by controller 120 such that operation of all of the instruments may be synchronized. In a conventional test system, each of the tests that involve capturing a response signal output by DUT 110 may incorporate a settling interval such that the output of DUT 110 is either not captured or discarded, if captured, during the settling interval. This settling interval may be repeated for every test performed on DUT 110 because each test may cause a change in the output signal. In embodiments in which analysis of the output signal generated by DUT 110 is adjusted for near-DC drift, the adjustment may be performed for each test.

One of the components controlled by pattern generator 140 may be timing generator 150. Timing generator 150 may also be a component or an instrument as known in the art. Though overall control of the test process may be determined by controller 120, instrument $130_1$ may generate timing signals to control operation of one or more components within instrument $130_1$ or another instrument $130_2 \ldots 130_N$. Those timing signals may occur at programmed times, providing flexibility for test system 100 to be programmed to perform tests for numerous different types of devices.

Timing signals generated by timing generator 150 may control other components, such as a waveform generator 160. Waveform generator 160 also may be a component as is known in the art. In this example, waveform generator 160 may be programmable to generate a periodic signal. In the embodiment illustrated, that periodic signal may be a sine wave having a frequency and amplitude programmed based on a specific test to be performed on DUT 110. Though, the invention is not limited to processing sinusoidal test signals and waveform generator 160, in some embodiments, may be programmable to generate a periodic signal of arbitrary waveform shape. In yet other embodiments, the DUT 110 may not require a stimulus for some or all particular tests, and in such cases waveform generator 160 may be disabled or may be not included within instrument $130_1$.

Regardless of the specific format of the signal generated by waveform generator 160, that signal may be coupled to DUT 110. Here that coupling is illustrated schematically as occurring through amplifier 162. The specific mechanical and electrical connections between waveform generator 160 and DUT 110 are not critical to the invention and, for simplicity, are not expressly illustrated in FIG. 1. Though, such coupling may be performed using techniques as are known in the art, or where no express stimulus signal is supplied, may not be present at all.

During a test of DUT 110, one or more output signals may be measured. FIG. 1 illustrates that one such output signal is measured by instrument $130_1$. As illustrated, a test point on DUT 110 where that output signal can be accessed is coupled to instrument $130_1$. The test point may be any suitable point where an electrical connection can be made and may be on a structure specifically incorporated to support testing access or may be a device to which electrical connection can be made during normal operation of the device. In this example, the output signal is coupled through buffer 166 and supplied to a digitizer at which the analog output is represented in digital form. Though, it should be appreciated that buffer circuit 166 is not critical to the invention. In the example of FIG. 1, capture circuit 180 may operate as a digitizer. Capture circuit 180 also may be as known in the art and, for example, may include a sampling circuit and an analog to digital converter. Though, it should be appreciated that the specific construction of capture circuit 180 is not critical to the invention.

Regardless of the specific construction of capture circuit 180, capture circuit 180 may acquire a series of samples of the output signal from DUT 110. These samples may be in digital form for processing in a digital processor. In the example of FIG. 1, the samples acquired by capture circuit 180 are supplied to preprocessor 182, which may be implemented as a digital signal processor or other suitable circuitry. In the embodiment illustrated in FIG. 1, samples captured by capture circuit 180 are supplied directly to preprocessor 182. However, embodiments are possible in which the captured samples are stored in digital memory or otherwise buffered until processed by preprocessor 182. Though, a configuration in which samples of an output signal are buffered before processing is not illustrated for simplicity.

Preprocessor 182 may be programmed, such as by computer executable instructions stored in program memory 184, to perform a processing technique that removes near-DC drift from a captured output signal according to embodiments of the invention. An adjusted output signal produced by preprocessor 182 after removing near-DC drift may then be provided to processor 190. Processor 190 may be a processor as is known in the art or may be any other suitable circuitry. Processor 190 may be configured to measure values of parameters of the captured output signal, such as its amplitude, total harmonic distortion, in band noise or inter-modulation signals. Though, it should be appreciated that the specific processing performed on a captured output of DUT 110 is not critical to the invention and processor 190 may be configured to perform any suitable processing.

The results of processing performed in processor 190 may be used to determine an appropriate disposition for DUT 110. Though, results of processing may be aggregated with other information collected by testing other devices under test to infer adjustments needed for a manufacturing operation used in manufacturing semiconductor devices or electronic assemblies, such as DUT 110.

It should be recognized that FIG. 1 illustrates preprocessor 182 and processor 190 as separate components. However, it is not a requirement of the invention that preprocessor 182 be separate from processor 190. In some embodiments, a test system may include a digital signal processing chip, device, instrument, or program and the functions of preprocessor 182 and processor 190 may be performed by the same digital signal processing chip, device, instrument, or program. Though, other implementations are possible. In other embodiments, preprocessor 182 may be a separate application specific integrated circuit (ASIC) or other circuitry. In embodiments in which preprocessor 182 is implemented at dedicated circuitry to remove near-DC drift from a captured output signal, the configuration of that circuitry may define its operation such that separate program memory 184 is not required. Though, a suitable implementation for a test system according to embodiments of the invention may incorporate a function into a programming library associated with a digital signal processor within the test system. The function may therefore be available to test engineers writing test programs for a device under test. When called, the function may accept as an input a set of samples captured from a device under test and may return a set of adjusted samples reflecting the captured signal with near-DC drift removed. The output of such a library function could be provided to one or more analysis functions prepared in a conventional way. Such a library function may be implemented, for example, by computer executable instructions in program memory 184 that are executed while test system 100 is executing a program that includes a call to the library function. Though, it should be appreciated that the techniques for removing near-DC drift may be incorporated into a test of a semiconductor device or electronic assembly in any suitable way.

Regardless of the manner in which the technique is incorporated into the test system, when invoked, removing near-DC drift may lead to accurate test results while occupying tester resources for a shorter time.

Figure 2:
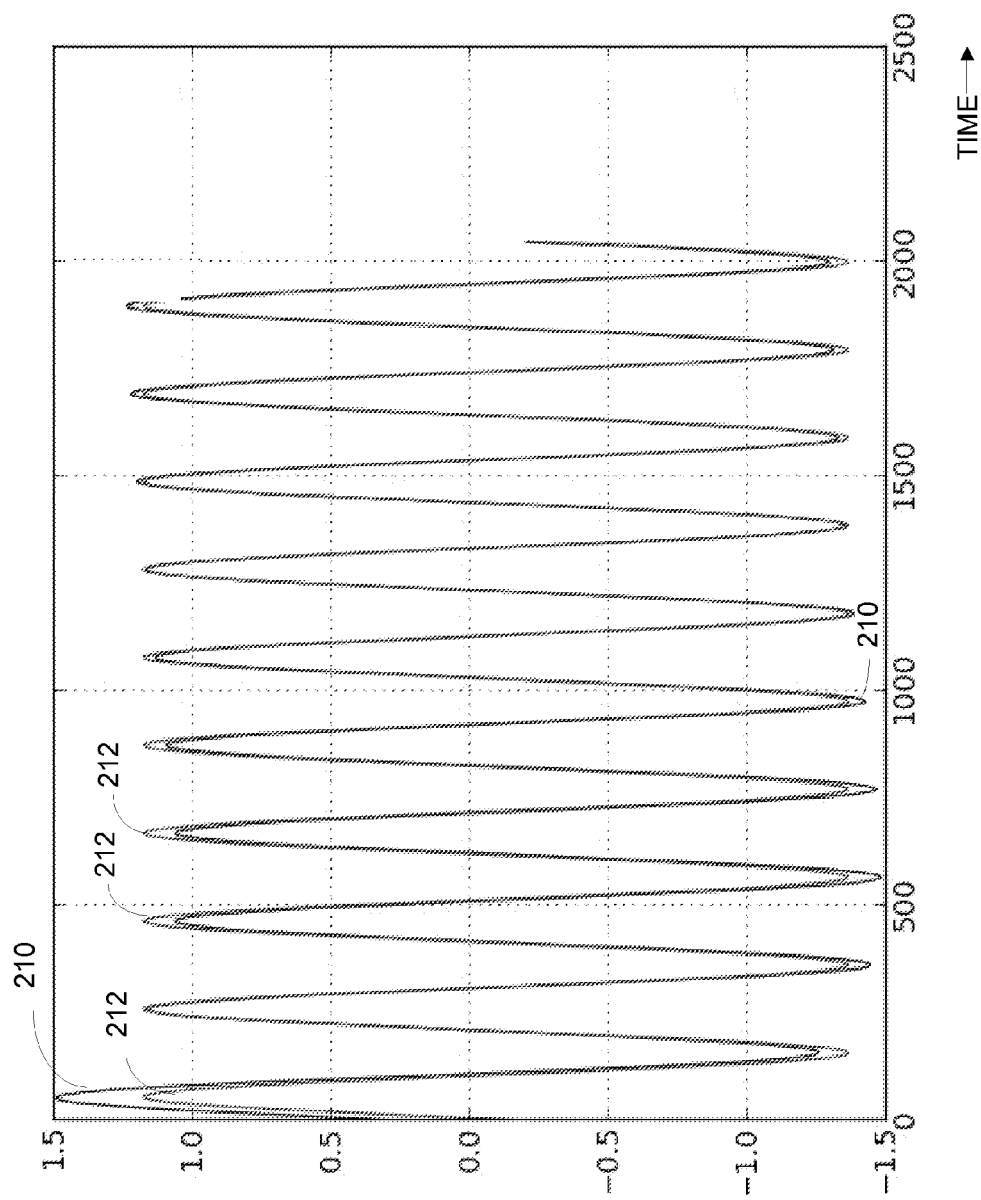
FIG. 2 is a plot illustrating differences between an output signal captured during a settling interval and an output signal at steady state.

FIG. 2 is a sketch illustrating an output 210 from device under test 110 that may be useful in understanding operation of a test system according to some embodiments. The plot includes a sample number axis. In this example, the plot begins with the first captured sample and illustrates the shape of the waveform over 2048 samples, though it should be appreciated that the specific number of samples is not material to the invention and any appropriate number of samples may apply. Though output signal 210 is periodic over this interval, it can be seen that the level around which signal 210 oscillates is changing over the interval during which samples of the output signal were captured.

Superimposed on output signal 210 is a representation of a steady state signal 212. Steady state signal 212 is likewise a periodic signal, but the level around which steady state signal 212 oscillates stays constant around zero in this example. Of course, in other examples, the average value of the signal in steady state may be non-zero. If sufficient samples of output signal 210 were captured, at the end of the settling interval for output signal 210, output signal 210 would appear similar to steady state signal 212.

In the example of FIG. 2, it can be seen that output signal 210 deviates more significantly from steady state signal 212 earlier on the time axis. As time passes, output signal 210 settles and more closely approximates steady state signal 212. In prior art test techniques, analysis was performed on the portions of output signal 210 after the settling interval, such that the captured output signal 210 would be very similar to steady state signal 212. In accordance with some embodiments of the invention, rather than avoiding sampling or discarding samples acquired during the settling interval, a mathematical adjustment is performed on the samples of output signal 210 to generate an adjusted signal that closely approximates steady state signal 210.

FIGS. 3A-3C illustrate processing that may be performed on a captured output signal according to some embodiments of the invention. FIG. 3A illustrates an output signal 310. In this example, output signal 310 is a generally sinusoidal signal. Here, four periods $P_1 \ldots P_4$ of output signal 310 are illustrated, though it should be appreciated that the specific number of periods of output signal 310 is not critical to the invention. As can be seen in FIG. 3A, output signal 310 is settling such that it is approaching its steady state value across periods $P_1$, $P_2$ and $P_3$, which here may be taken as illustrating the settling interval. The output signal 310 is illustrated as having substantially reached its steady state value by period $P_4$. It should be appreciated, however, that settling over four periods is illustrated in FIG. 3A for simplicity of illustration. An actual output signal may require fewer or more than four periods in order to reach steady state.

In a test system, such as test system 100, in which an output signal is captured in digital form for processing, output signal 310 may be represented by a series of samples. Here, a series of periodic samples is illustrated, though only samples $312_1$, $312_2 \ldots 312_N$ are numbered for simplicity of illustration.

In accordance with some embodiments of the invention, the samples $312_1, 312_2 \ldots 312_N$ are processed to compute a settling profile of the output signal 310. The settling profile represents the change in the amount of near-DC drift as a function of time and may be computed in any suitable way that extracts the near-DC drift component from output signal 310 over the settling interval. In the embodiment illustrated in FIG. 3B, a set of values representing DC drift is computed and the settling profile is obtained by fitting a curve to these values.

In the example of FIG. 3B, samples spanning a period are used to generate a value representative of the value of the DC drift in output signal 310 during that period. A computed value for each of multiple periods is used as a data point in a data set to which a curve is then fit to model the settling profile. FIG. 3B shows a data set with four such values, each corresponding to one of the four periods $P_1 \ldots P_4$ illustrated in FIG. 3A. Specifically, value $320_1$ represents output signal 310 during period $P_1$. Value $320_2$ represents output signal 310 during period $P_2$. Value $320_3$ represents output signal 310 during period $P_3$, and value $320_4$ represents output signal 310 during period $P_4$.

The values $320_1 \ldots 320_4$ representing the near-DC drift in output signal 310 during each period may be generated in any suitable way that allows separation of the near-DC drift component of output signal 310 from the steady-state component of the signal. In the example illustrated, each of the values $320_1 \ldots 320_4$ is computed from the corresponding samples $312_1, 312_2 \ldots 312_N$ in a period of output signal 310. In this case, each of the values $320_1 \ldots 320_4$ represents the average value of the samples $312_1, 312_2 \ldots 312_N$ in a corresponding period of output signal 310.

One suitable method for forming a data set includes taking the average y value (representing signal level) over one period, which for a sinusoidal signal may be the wavelength, in the captured samples. The corresponding x value (representing time or sample number) is chosen as the center point of that wave. This computation may be repeated for each wave in the same array. If the sample length is 2K (N=2048) samples, for instance, and the expected DUT output signal is a tone in bin (M=10) of a Fast Fourier Transform (FFT) of the captured output signal, then the wavelength is:

$$\lambda_{samples} = \frac{N}{M} = \frac{2048}{10} = 204.8 \qquad (1)$$

This value may be truncated to 204 samples for finding the average. The Corresponding x value may be chosen as an integer sample number as well. Though it should be appreciated that the specific number of samples chosen, as well as whether that number is truncated, raised to the next integer, or otherwise adjusted is not critical to the invention.

This "wavelength average" represents the approximate DC offset of that particular wave. Each of these wavelength averages will go up or down as the signal settles, but will not carry information about the DUT output tone, its harmonics, distortion products, or any noise except at near-DC frequencies. Accordingly, such wavelength averages provide a suitable representation of near-DC drift for curve fitting, though it should be appreciated that the specific method of selecting a suitable representation of the near-DC drift for the particular periods of the signal is not critical to the invention.

For curve fitting, it is not necessary that averages be computed over all wavelengths of the captured output signal. Rather, in some embodiments a wavelength average may be determined over a sufficient number of waves to find the polynomial of a desired order approximating the settling profile of the output signal. Though, in some embodiments, a wavelength average is included for at least the first and last full wavelengths in the sample set.

Though a specific technique for determining a data set for curve fitting has been described, it should be recognized that other approaches may be used for generating values representative of the DC drift component of output signal 310. As one example of an alternative technique, the maximum value of output signal 310 during each of multiple periods may be used to generate a data set to which a curve can be fit. Also, though representing output signal 310 by a data set with fewer values than there are samples $312_1, 312_2 \ldots 312_N$ may have advantages in some embodiments, such as reducing processing complexity and reducing the susceptibility of the process to noise in the measured output signal 310, it is not a requirement that a single value representing each period of output signal 310 be generated. More than one sample per period could be generated. In some embodiments, curve fitting may be performed based on as many as all of the samples $312_1, 312_2 \ldots 312_N$ of output signal 310.

Regardless of the number and manner in which values $320_1 \ldots 320_4$ forming a data set are generated, a settling profile modeling this DC drift may be computed by fitting a curve to the values. FIG. 3B illustrates a curve 330, representing a settling profile of output signal 310, that has been fit to the set of values $320_1 \ldots 320_4$. Curve 330 may be in any suitable form. Likewise, curve 330 may be fit to the values representing the DC drift component of output signal 310 in any suitable way. In some embodiments, curve 330 is fit to the samples using a least squares technique. In some embodiments, curve 330 may be a polynomial. In other embodiments, curve 330 may be an exponential or a spline curve, such as a cubic spline.

In some embodiments, the curve fit to the data points representing the trend curve of the near-DC drift may be represented as a Newton Form polynomial. The polynomial may be of any suitable order. Though, as the order, of the polynomial increases, the processing required for curve fitting also increases. In some embodiments, the order may be 4 to 8. As a specific example, a seventh order polynomial may provide a desirable compromise between a good fit and an acceptable level of processing.

Though, any suitable curve may be fit to the data set in any suitable way. As a specific example of how this curve fitting may be performed, a polynomial may be fit to a set of data points using a system of simultaneous equations. These may be presented in matrix form (2):

$$\begin{bmatrix} y_1 \\ y_2 \\ \vdots \\ y_n \end{bmatrix} = \begin{bmatrix} 1 & x_1 & x_1^2 & \ldots & x_1^k \\ 1 & x_2 & x_2^2 & \ldots & x_2^k \\ \vdots & \vdots & \vdots & \ddots & \vdots \\ 1 & x_n & x_{1n}^2 & \ldots & x_{k^n} \end{bmatrix} \begin{bmatrix} a_0 \\ a_1 \\ \vdots \\ a_n \end{bmatrix} \quad \text{EQ. (2)}$$

The square matrix in EQ. 2 is known as a Vandermonde Matrix. Each row of the Vandermonde Matrix contains just one of the x-coordinate values of the data points to be fitted, and each column has the x value of its row raised to sequential exponents from 0 to k. When used for polynomial regression, the $k^{th}$ power corresponds to a $k^{th}$ order polynomial approximation curve. The column vector left of the equals sign holds the y-values of the data points, and the column vector on the right holds the coefficients of the desired polynomial curve. It is this coefficient vector that may be found to define a polynomial that fits the data set.

We can express (2) in matrix notation as (3):

$$y = Va \quad \text{EQ. (3)}$$

Using $V^T$ as the matrix transform of V, we multiply both sides of EQ. 3 by $V^T$ and apply some basic algebra to solve for the coefficient vector as in Equation (4):

$$a = (V^T V)^{-1} V^T y \quad \text{EQ. (4)}$$

The standard approach to finding the numerical solution of Equation 4 involves Gaussian Elimination with a number of floating point operations ("flops") that is on the order of $n^3$, and results in a polynomial of the form given in Equation (5):

$$a_o + a_1 x + a_2 x^2 + \ldots + a_k x^k = \hat{y} \quad \text{EQ. (5)}$$

Such an approach may be used to fit a polynomial to the data. However, in some embodiments, other forms of polynomials may be used. A Newton Form Polynomial may be used and may reach a numerical solution with less computation than solving with the Vandermonde matrix. Such a technique may be less susceptible to errors in the data set (noise, roundoff error, etc.), yielding lower errors in the resulting polynomial coefficients. Though, a polynomial may be expressed in other forms, such as Legendre or Bernstein, which may alternatively be used.

In embodiments in which a Newton Form Polynomial is used, the polynomial may be expressed by Equation (6):

$$\hat{y} = b_0 + b_1(x-x_0) + b_2(x-x_0)(x-x_1) + b_2(x-x_0)(x-x_1)(x-x_2) + \ldots + b_k(x-x_0) \ldots (x-x_k) \quad \text{EQ. (6)}$$

Here, "b" is used for the coefficients of the polynomial to indicate that the coefficient values will be different in the Newton Form than those of the Standard Form.

The Newton Form polynomial may be solved numerically by constructing a triangular matrix of divided differences of the form (7) through (9).

$$[y_0] = y_0 \quad \text{EQ. (7)}$$

$$[y_0, y_1] = \frac{y_1 - y_0}{x_1 - x_0} \quad \text{EQ. (8)}$$

$$[y_0, y_1, y_2] = \frac{[y_1, y_2] - [[y]_0 y_{1,}]}{x_2 - x_0} = \frac{\frac{y_2 - y_2}{x_2 - x_1} - \frac{y_2 - y_0}{x_1 - x_0}}{x_2 - x_0} \quad \text{EQ. (9)}$$

Such computations may be performed using techniques as are known in the art.

Regardless of the manner in which curve 330 is obtained, curve 330, representing the settling profile of output signal 310, may be used to adjust output signal 310 to produce an adjusted output signal 350 (FIG. 3C). In the example illustrated, adjusted output signal 350 is generated by subtracting a corresponding value of curve 330 from each of the samples $312_1$, $312_2$ . . . $312_N$. For example, sample $352_1$ of adjusted output signal 350 is formed by subtracting a value of curve 330 at a corresponding time position from sample $312_1$ of the unadjusted output signal 310. Similarly, a value for sample $352_2$ in adjusted output signal 350 may be formed by subtracting a value of curve 330 at a corresponding time position from sample $312_2$, and a value for sample $352_N$ in adjusted output signal 350 may be formed by subtracting a value of curve 330 at a corresponding time position from sample $312_N$. Since curve 330 in FIG. 3B is represented by a suitable mathematical expression, such as a polynomial in some embodiments, it can generate a value corresponding to the near-DC drift at each point in $312_1$ . . . $312_N$ in the sample set, therefore each of the other samples of adjusted output signal 350 may be similarly formed.

Once adjusted output signal 350 is formed, it may be used in a test operation in the same way that a steady state signal was used in the prior art or in any other suitable way. Though, the adjusted output signal 350 may be formed based on samples collected during an interval shorter than would have been required using prior art techniques for output signal 310 to reach steady state and then acquire samples for analysis.

In some embodiments, multiple iterations of the curve fitting process may be performed to adjust an output signal. In each iteration, the new near-DC drift may be modeled and subtracted from the adjusted signal generated in the prior iteration. At each iteration, the amount of near-DC drift in the adjusted signal may be further reduced. Though, an arbitrarily large number of iterations may not be desirable in some embodiments. The number of iterations performed may entail a tradeoff between goodness of fit and computational complexity. As an added factor, when multiple iterations are performed, inaccuracies from iteration to iteration may accumulate, such that, if too many iterations are performed, accuracy may decrease as the number of iterations increases and errors accumulate from one iteration to the next.

In some instances, the type of curve fit to the data set may impact the number of iterations performed. Fitting a Newton Form polynomial, for example, may be desirable because fitting a Newton Form polynomial to a set of data points may require less computation then fitting a polynomial in other forms. Also, the Newton Form polynomial may be less susceptible to noise. Nonetheless, in some embodiments, it may be desirable to limit the number of iterations, such as to be between 4 and twelve, inclusive, or to ten or less. As a specific example, in some embodiments, it may be desirable to perform eight iterations using curve fitting based on a seventh order Newton Form polynomial.

Figure 4:
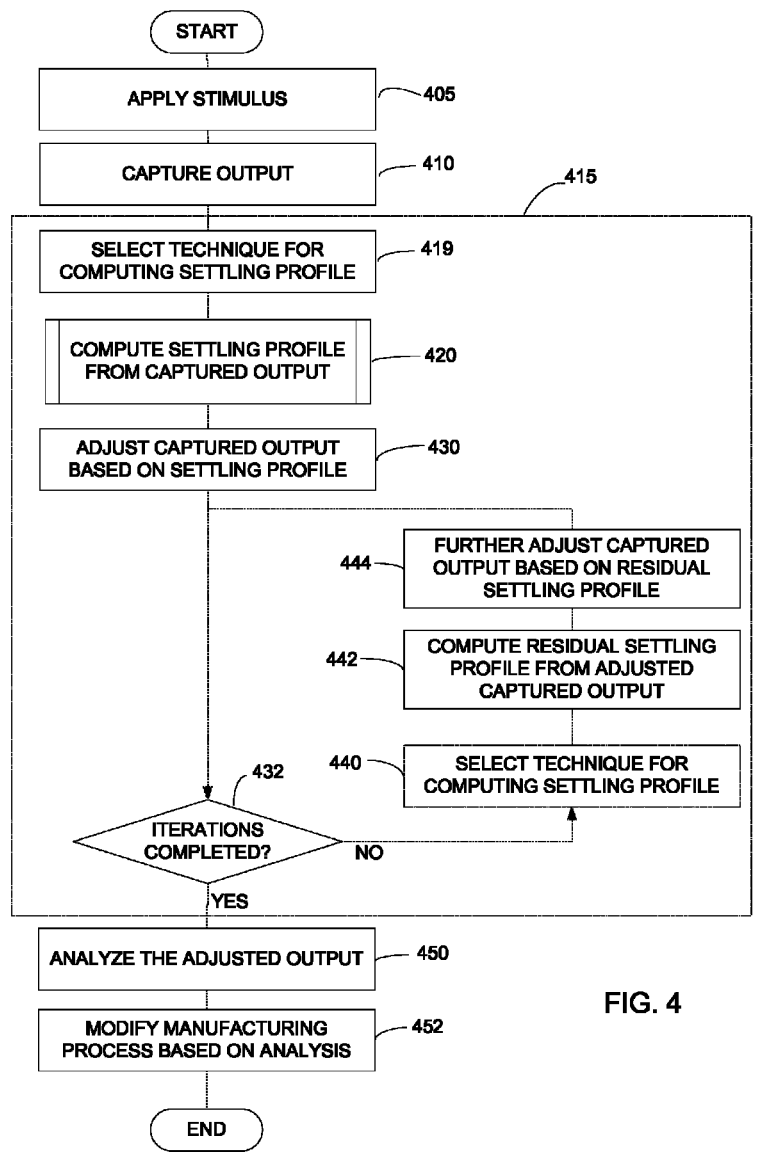
FIG. 4 is a flowchart of a process of adjusting an output signal according to some embodiments of the invention.

FIG. 4 illustrates a method of operating a test system that adjusts the samples of an output signal for a settling profile according to some embodiments of the invention. The process may be performed by a test system, such as automatic test system 100 (FIG. 1). Though, it should be appreciated that the process of FIG. 4 may be performed with any suitable equipment.

The process of FIG. 4 may begin at block 405 in an embodiment in which a stimulus signal is expressly applied. The process of FIG. 4 may be initiated in a semiconductor or electronic assembly manufacturing operation when a device under test, such as DUT 110, is coupled to test system 100 and a test of that device is initiated. As part of the test, one or more stimulus signals may be applied to the device under test or some other event may occur, giving rise to an output signal to be captured and analyzed. Accordingly, at block 405 one or more stimulus signals are applied to the device under test. Such stimulus signals may be applied in any suitable way, including using techniques as are known in the art.

At block 410, samples of the output signal are captured. Such samples may be captured by a capture circuit, such as capture circuit 180 (FIG. 1), or in any other suitable way. In accordance with some embodiments, it is not necessary to wait for the output signal to reach steady state before samples for analysis are captured. Accordingly, processing at block 410 may begin with little or no delay following processing at block 405. In this way, the interval between the start of block 405 and the end of block 410 during which test resources are utilized for a test may be shorter than in the prior art.

Once the samples are captured or, in some embodiments, concurrently with the capturing of samples, a sub-process 415 may be performed using captured samples of the output signal. Processing in 415 adjusts the captured output to compensate for near-DC drift. In the embodiment illustrated in FIG. 1, sub-process 415 may be performed by preprocessor 182. Though, it should be appreciated that sub-process 415 may be performed in any suitable hardware components.

Regardless of the specific hardware used in performing sub-process 415, processing during sub-process 415 may begin at block 419. A technique for computing a settling profile may be selected. In the example of FIG. 4, processing at block 419 represents an optional step that may be performed in some embodiments. In this example, different techniques for computing a settling profile may be available and each test being performed may include a specification of a specific technique to be used. For example, it is described above that a settling profile may be determined by fitting a polynomial of a specific order or a curve represented in any suitable way. Accordingly, processing at block 419 may involve determining a type of curve or a value of any suitable parameter of a curve that may be used for representing a settling profile. These values may be determined, for example, by reading values of programmed parameters or in any other suitable way.

Figure 5:
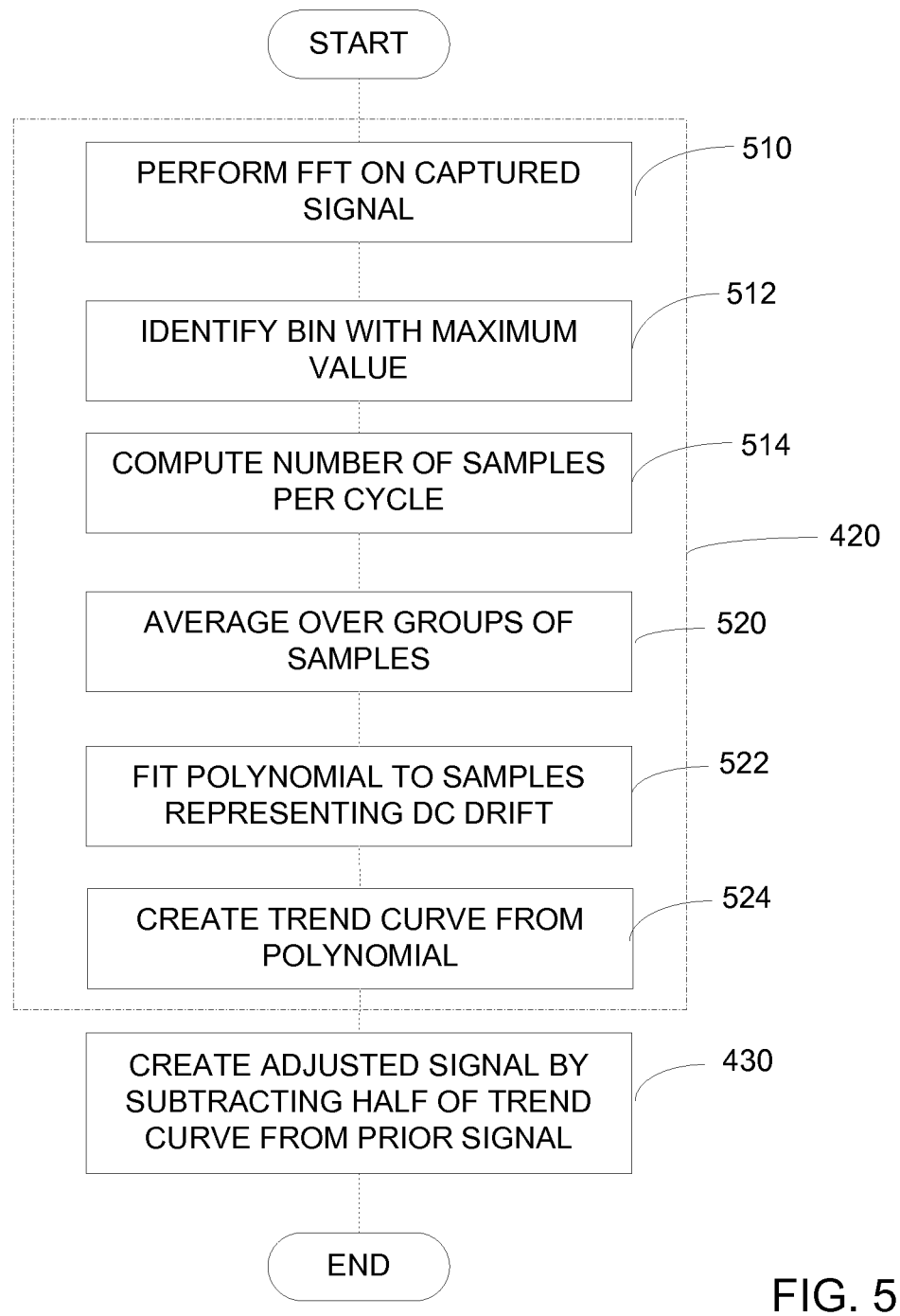
FIG. 5 is a flowchart illustrating further details of some processing steps illustrated in the flowchart of FIG. 4.

At block 420, a settling profile may be computed from the captured output. The computed settling profile may be used to adjust the captured output at block 430. FIG. 5, described below, provides in more detail an example of the processing that may be performed at block 420 and block 430.

Regardless of the specific mechanism by which the settling profile is computed and used to adjust the captured output, the process of FIG. 4 may proceed to decision block 432. In the example of FIG. 4, an adjusted output signal is computed iteratively. Each iteration, after the first, is performed by fitting a curve, representing the settling profile, to a data set derived from the adjusted output computed in the prior iteration. In the first iteration, as represented by blocks 410, 420, and 430, the settling profile may be computed directly from the captured output. Any suitable mechanism may be used to determine the number of iterations to be performed in computing an adjusted output. In some embodiments a fixed number of iterations may be performed. As a specific example, in some embodiments, the number of iterations may be six or more. Though, in other embodiments, the number of iterations may be twelve or less. Accordingly, it some embodiments between six and twelve, inclusive, iterations may be performed. In yet further embodiments, only a single iteration may be performed. In such an embodiment, decision block 432 may be omitted.

Though, it should be appreciated that other techniques may be suitably employed to determine at decision block 432 whether a desired number of iterations has been completed, for example, the magnitude of a settling profile computed at an iteration may be an indication of whether further iterations would be useful. As one example, if the maximum amplitude of the settling profile is below a threshold, processing at decision block 432 may determine that a desired number of iterations has been completed. Conversely, if, from iteration to iteration, the maximum or average magnitude of the computed settling profile increases, processing at decision block 432 may determine that the desired number of iterations has been completed. As another example, after each iteration a linear least square fit may be employed, as known in the art, and if the magnitude of the slope is below a threshold, processing at decision block 432 may determine that a desired number of iterations has been completed.

Regardless of the manner in which the number of iterations is determined at block 432, if a further iteration is to be performed, the process branches to block 440. In the example of FIG. 4, processing at block 440 represents an optional step that may be performed in some embodiments. In this example, different techniques for computing a settling profile may be used in different iterations. As a specific example, in some embodiments a settling profile may be computed in the first iteration by fitting a seventh order polynomial to values derived from the captured output. In subsequent iterations, the settling profile may be computed by fitting a lower order polynomial to the adjusted output computed in the prior iteration. Accordingly, processing at block 440, similar to the processing at block 419, may entail selecting the technique for computing the settling profile based on the iteration that is being performed. Though, processing at block 440 is indicated at optional because, in some embodiments, the same approach for computing a settling profile may be used in all iterations.

Regardless of the specific technique used in each iteration, processing may proceed to block 442. At block 442, a residual settling profile may be computed based on the adjusted captured output computed in the prior iteration. During the second iteration, for example, the adjusted captured output will be that computed at block 430. In subsequent iterations, the adjusted captured output will be as computed at block 444 during processing in the prior iteration.

Once the residual settling profile is computed at block 442, processing proceeds to block 444 where the residual settling profile is applied to further adjust the adjusted captured output. In embodiments in which an adjusted output is computed by subtracting values representing the settling profile, processing at block 444 constitutes a further subtraction based on the residual settling profile computed at block 442.

Regardless of the manner in which the further adjustment is made, processing loops back to decision block 432. At decision block 432, processing may again branch to block 440 if further iterations are to be performed. If no further iterations are to be performed, processing branches from decision block 432 to block 450. At block 450, the adjusted output is analyzed. In some embodiments, processing at block 450 may be performed in processor 190 (FIG. 1) or other suitable components within a test system. Processing at block 450 may include any operation that is performed in a conventional test system on a steady state output.

Once the analysis is completed at block 450, the process may proceed to block 452. At block 452, the semiconductor manufacturing operation may be modified based on the analysis. Processing at block 450 may be similar to that performed in a conventional semiconductor or electronic assembly manufacturing operation and may include one or more operations that are conditionally performed based on results of tests on one or more devices. For example, as a result of analysis indicating that the device under test that generated the captured output signal is faulty, that device may be routed to a portion of the manufacturing facility where the device or assembly may be repaired or discarded. In embodiments in which the test system is performing a test on a semiconductor device as part of a wafer, the device may be separated from a stream of parts being manufactured and discarded without packaging the device or subsequent processing. In other embodiments, the analysis may be used for performance binning of the device under test. In yet other embodiments, the analysis may alternatively or additionally be used to identify adjustments to a semiconductor or electronic assembly manufacturing operation that may increase the yield of good parts being manufactured. Accordingly, it should be appreciated that modifications to the manufacturing process performed at block 452 may entail any suitable modifications.

Turning to FIG. 5, an example of processing that may be performed within process block 420 and process block 430 is illustrated. The processing begins at block 510. In this example, processing at blocks 510, 512 and 514 is used to determine the number of samples to average to produce a value representative of the captured output signal. For example, FIGS. 3A and 3B illustrate that each of the cycles of output signal 310 includes eight samples. Each of the eight samples is averaged to produce one of the samples $320_1 \ldots 320_4$ representing the DC drift in the output signal 310. Though, it should be appreciated that the number of samples per cycle to be averaged may depend on the frequency of the output signal as well as the sample rate of the data capture circuit. Accordingly, a technique for determining the number of samples of the output signal to produce samples representing the DC drift may be performed.

In the example of FIG. 5, processing to determine a number of samples to average is performed by blocks 510, 512 and 514. At block 510, a Fast Fourier Transform (FFT) is performed on the captured output signal. The results of the FFT operation are analyzed at block 512 determine the largest frequency component in the captured output signal. At block 512, the largest frequency component is determined by identifying the bin of the FFT with the maximum absolute value.

At block 514, the number of samples per cycle is computed by dividing the length of the captured output signal (which may be expressed as a number of samples) by the bin identified at block 512. Once a number of samples per cycle is identified at block 514, that number may be used to average over groups of samples representing a period of the captured output signal.

Once the averages are generated at block 520, these averages may be taken at a set of values of the DC drift of the captured output signal. Such an approach may be used to analyze a sinusoidal signal. Even if the signal is not sinusoidal, this approach may also be used. Though, for non-sinusoidal signals, other techniques may be used to determine a number of samples in a period or to analyze the signal to represent DC drift.

Regardless of how the set of values is generated, a polynomial, exponential, or other chosen curve may be fit to the values to characterize the settling profile, as illustrated in FIG. 3B. At block 524, the polynomial computed at block 522 may be analyzed to extract the trend curve from the polynomial.

The trend curve may represent the portion of the polynomial, excluding any steady state component. In the example of FIG. 3B, the steady state value of the curve 330 is indicated by S. The trend curve may be computed from the curve 330 by subtracting the value S from the curve 330.

Regardless of the manner in which the trend curve is created, processing may proceed to block 430 where an adjusted signal is created by subtracting an amount equal to the trend curve from the prior signal. In some embodiments, a weighted portion of the trend curve is subtracted in block 430, such as half, or one quarter. In embodiments in which an iterative process is performed, the prior signal, in the first iteration, may be the captured output signal. In subsequent iterations, the prior signal may be the adjusted signal computed in the prior iteration.

Having thus described several aspects of at least one embodiment of this invention, it is to be appreciated that various alterations, modifications, and improvements will readily occur to those skilled in the art.

For example, a technique for adjusting an output signal to remove the effects of near-DC drift is described to be implemented as a preprocessor in an automatic test system for testing semiconductor devices or electronic assemblies. Such a preprocessor may, in near real-time, provide adjusted output signals for further analysis of a device under test. However, the technique may be implemented in any suitable processor at any suitable time. It may, for example, be implemented as a program executed by a controller for a test system or other available computer.

Also, the adjustment of the output signal need not occur in real time. For example, samples of an output signal may be captured and subsequently analyzed. Even though, in this scenario, there is a delay until the output signal is analyzed that likely exceeds the settling interval, it may nonetheless be desirable to computationally adjust the output signal to remove the effects of near-DC drift because the time during which test system resources are occupied stimulating and measuring a response from a DUT is reduced, thereby increasing the throughput of the test system.

Further, it is not a requirement that the technique be applied in automatic test equipment. The technique may be incorporated into any test equipment, whether or not automated.

Additionally, though testing semiconductor devices is described as an exemplary use of the inventive techniques, it should be appreciated that the techniques described herein may be applied for testing any type of device having an analog output, such as cell phones or audio systems. Moreover, it should be appreciated that, though the techniques are useful as pre-processing for a test function, they are not so limited and can be used for pre-processing an analog signal for any suitable subsequent processing.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device. Further, the computer may be physically connected to and part of the test system, or it may be connected via such interfaces as known in the art including, for example Ethernet, Bluetooth, WiFi, USB, the Internet, etc.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above. As used herein, the term "non-transitory computer-readable storage medium" encompasses only a computer-readable medium that can be considered to be a manufacture (i.e., article of manufacture) or a machine.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of manufacturing an electronic device, the method comprising:
    testing the electronic device, the testing comprising processing a signal by:
        receiving a plurality of samples of a periodic signal representing the output of the electronic device;
        with at least one processor, computing from at least a portion of the plurality of samples a first settling profile of the periodic signal;
        subtracting the first settling profile from the plurality of samples to obtain a first plurality of adjusted samples; and
        performing an analysis function on the first plurality of adjusted samples; and
    conditionally performing at least one manufacturing operation for the electronic device based on the results of testing the electronic device.

2. The method of claim 1, wherein computing comprises fitting a polynomial to the plurality of samples.

3. The method of claim 1, wherein computing comprises fitting an exponential curve or a spline to the plurality of samples.

4. The method of claim 1, further comprising:
    computing from the first plurality of adjusted samples a second settling profile of the first plurality of adjusted samples; and
    subtracting the second settling profile from the first plurality of adjusted samples to obtain a second plurality of adjusted samples.

5. The method of claim 4, wherein computing comprises fitting a first curve to the plurality of samples and a second curve to the first plurality of adjusted samples.

6. The method of claim 5, wherein the first curve and the second curve are different.

7. The method of claim 1, wherein computing comprises fitting a curve to the plurality of samples.

8. The method of claim 7, wherein the method further comprises iteratively:
    fitting a curve to the plurality of samples and adjusting the plurality of samples by, in each iteration after the first:
    computing a model of the settling in the output of the electronic device reflected in the adjusted samples provided in a preceding iteration; and
    providing adjusted samples by subtracting values in the model of the settling computed in the iteration from the adjusted samples provided in the preceding iteration.

9. The method of claim 8, wherein fitting the curve to the plurality of samples comprises fitting a polynomial to the plurality of samples in the first iteration and, for each iteration after the first iteration, fitting a polynomial to the adjusted samples provided in the preceding iteration.

10. The method of claim 8, wherein iteratively fitting the curve comprises performing between 6 and 12 iterations, inclusive.

11. The method of claim 10, wherein in at least a portion of the iterations the curve is a polynomial having an order between 4 and 8, inclusive.

12. The method of claim 11, wherein the fitting the polynomial comprises fitting a Newton Form polynomial.

13. A test system comprising:
    a digitizer configured to receive an output of a device under test;
    a pre-processor configured to:
        receive a plurality samples from the digitizer;
        derive a settling profile in the output of the device under test based on the plurality of samples; and
        subtracting the settling profile from the plurality of samples to produce a plurality of adjusted samples; and
    a processor configured to receive the plurality of adjusted samples and perform a test function based on the plurality of adjusted samples.

14. The test system of claim 13, wherein the pre-processor comprises an ASIC.

15. The test system of claim 13, wherein the pre-processor comprises a digital signal processor.

16. The test system of claim 15, wherein the pre-processor is configured by computer-executable instructions to derive the settling profile and adjust the plurality of samples.

17. The test system of claim 16, wherein the computer-executable instructions comprise a portion of a digital signal processing library.

18. A non-transitory, computer-readable storage medium comprising computer-executable instructions that, when executed, test an electronic device according to a method comprising:
- processing a plurality of samples of a periodic signal representing an output of the electronic device by:
  - fitting a polynomial to at least a portion of the plurality of samples;
  - subtracting values based on the polynomial from the plurality of samples to provide adjusted samples, the values based on the polynomial representing settling in the output of the electronic device; and
- conditionally performing at least one operation on the electronic device based on the results of processing the plurality of samples.

19. The non-transitory, computer-readable storage medium of claim 18, wherein the method comprises iteratively producing adjusted samples by, in each iteration after a first iteration:
- fitting a polynomial to at least a portion of the adjusted samples provided in a preceding iteration; and
- providing adjusted samples by subtracting from the adjusted samples provided in the preceding iteration the values based on the polynomial fit to the adjusted samples in the iteration.

20. The non-transitory, computer-readable storage medium of claim 19, wherein the computer-executable instructions comprise a function of a custom digital signal processing library that accepts as an input the plurality of samples and provides as an output the adjusted samples provided at a final iteration.

21. The non-transitory, computer-readable storage medium of claim 20, wherein iteratively producing adjusted samples comprises performing a predetermined number of iterations, the predetermined number being between 6 and 12, inclusive.

22. The non-transitory, computer-readable storage medium of claim 19, wherein the polynomial in different iterations have different orders.

23. The non-transitory, computer-readable storage medium of claim 22, wherein the polynomial is a Newton-form polynomial.

* * * * *